| United States Patent [19] | [11] Patent Number: 4,916,086 |
| Takahashi et al. | [45] Date of Patent: Apr. 10, 1990 |

[54] METHOD OF MANUFACTURING A SEMICONDUCTOR DEVICE HAVING ROUNDED TRENCH CORNERS

[75] Inventors: Kouichi Takahashi, Kawasaki; Hiroshi Kinoshita, Yokohama; Naoto Miyashita, Kawasaki; Hironori Sonobe, Yokohama, all of Japan

[73] Assignee: Kabushiki Kaisha Toshiba, Kawasaki, Japan

[21] Appl. No.: 204,550

[22] Filed: Jun. 9, 1988

[30] Foreign Application Priority Data

Jun. 18, 1987 [JP] Japan ................................ 62-150281

[51] Int. Cl.⁴ .......................................... H01L 21/76
[52] U.S. Cl. ...................................... 437/62; 437/67
[58] Field of Search ................. 437/67, 233, 62, 238; 156/643

[56] References Cited

U.S. PATENT DOCUMENTS

| 4,645,564 | 2/1987 | Morie et al. | 156/643 |
| 4,666,556 | 5/1987 | Fulton et al. | 156/643 |
| 4,693,781 | 9/1987 | Leung et al. | 156/643 |

FOREIGN PATENT DOCUMENTS

| 53-148988 | 12/1978 | Japan . | |
| 58-64045 | 4/1983 | Japan | 437/67 |
| 58-168233 | 10/1983 | Japan | 437/67 |
| 61-176133 | 8/1986 | Japan | 437/67 |

*Primary Examiner*—Olik Chaudhuri
*Attorney, Agent, or Firm*—Oblon, Spivak, McClelland, Maier & Neustadt

[57] ABSTRACT

A method of manufacturing a semiconductor having a trench region is disclosed. After an etching process for forming an trench region in a substrate, the corners of the trench region are covered with a polycrystalline layer. The structure is subjected to an oxidation treatment. Since the polycrystalline layer covers the corners roundly, the oxidation results in semiconductor islands having rounded corners.

5 Claims, 6 Drawing Sheets

METHOD OF MANUFACTURING A SEMICONDUCTOR DEVICE HAVING ROUNDED TRENCH CORNERS

BACKGROUND OF THE INVENTION

1. Field of the Invention

This invention concerns a method of manufacturing a semiconductor device. More particularly, this invention relates to a method of forming an improved trench region for the purpose of isolation of semiconductor elements formed in a semiconductor substrate.

2. Description of the Prior Art

Conventionally, a trench method using trenches filled with a dielectric material and a polycrystalline silicon layer is used for the separation of semiconductor elements. FIG. 1 shows an example of a conventional trench method. At first, an insulating layer 3 of sufficient thickness to serve as a mask layer for a following etching process is formed on the surface of the epitaxial growth layer 2 of P type (or N type) formed on the semiconductor substrate 1 of N type (or P type). The insulating layer 3, e.g., a silicon oxide layer, is selectively removed by conventional photoetching techniques to expose the surface of the layer 2 where a trench region is to be formed, as shown in FIG. 1A. Next, an etching process is carried out to form trench regions 5 using the insulating layer 3 as the mask. The depth of the trench regions 5 is chosen approximately equal to the depth of an isolation region to be formed. In this condition, an ion-implantation process, using dopant of the same conductivity type to the substrate 1, is carried out to form a channel stopper region (not illustrated) beneath the trench region to reduce a parasitic MOS effect. Next, an oxidation treatment is carried out to form an insulating layer 4, e.g., a silicon oxide layer, for the purpose of protection and partial filling of the trench regions 5. Next, a polycrystalline layer is formed to fill and cover the trench regions 5, completely. Next, an etching process is carried out to remove any excess polycrystalline layer above the top of the trench regions 5(FIG. 1C). Then, an oxidation treatment is carried out to form an insulating layer 7 on the top surface of the polycrystalline layer 6 to get a flat surface as shown in FIG. 1D. In this way, insulated island regions 201, 202 and 203 are achieved. In this conventional process, at the formation of the thick insulation film 4, e.g., between 8,000 Å and 10,000 Å, great stress is applied to the corner of the trench region 5. In particular, since the corners are sharp, stress concentration occurs at the corners. This stress causes crystal defects 19 in the island regions 201, 202 and the substrate 1, as shown in FIG. 1E. To reduce the stress during the formation of the thick insulating layer, another process using a thin insulating film has been used. FIG. 2 shows an example using a thin insulating film 12, e.g., less than 2000 Å. FIG. 2A shows a state after the formation of insulated island regions 11 and 14. However, in the case where a thick insulating layer 16, such as a field oxide layer, is successively formed, wedge-shaped insulating regions are formed at the corners of the island regions 11 and 14, as illustrated by numeral 17(FIG. 2B). Thus, stress is applied to the corners of the epitaxial layers 11 and 14, and crystal defects also are created. FIG. 3 shows an improved conventional process to reduce the stress concentration at the corners of the trench region by rounding the corners thereof. After forming the trench region in a semiconductor substrate 20 as illustrated in FIG. 3A, an insulating layer 21 is formed, as illustrated in FIG. 3B. Next, the insulating layer 21 is removed, as illustrated in FIG. 3C. As the insulating layer 21 is formed by the reaction of oxygen diffused into the substrate 20 with the material, e.g., silicon, of the substrate 20, the boundary between the insulating layer 21 and the substrate 20 is determined by the profile of the diffused oxygen. As the constant density line of the diffused oxygen at the corners is round, the formation of a rounded corner would be expected. However, at the formation of the insulating layer 21, stress is also applied to the substrate. The more the stress is applied, slower the growth rate of the insulating layer becomes. As the stress concentration occurs at the corners, the growth rate of the insulating layer at the edge of the corners is slower than that at other portions. As a result, a sharp portion is formed at the corner of the trench region, as illustrated in FIG. 3D. This process is also insufficient to round the corner. In the case where a trench capacitor (not illustrated) is formed in the trench region, the sharp portion causes a concentration of the electric field.

SUMMARY OF THE INVENTION

Accordingly, an object of this invention is to provide a method for effectively rounding the corners of the trench region. In accordance with one aspect of the invention, the corners of the trench region are effectively rounded by, preparing a semiconductor substrate having a first surface; forming a trench region in the first surface of the substrate, having corners at the intersections of the trench region with the first surface; forming a first polycrystalline layer on the first surface covering the corners of, and only partially filling the trench region, and oxidizing the first polycrystalline layer, thereby rounding the corners of the trench region and only partially filling the trench region.

In accordance with this invention, as the corners of the trench region are rounded, a thick insulating film can be formed without causing stress concentrations towards the corners of the trench region. Furthermore, the rounded corners reduce the electric concentration when a trench capacitor is formed at the trench region. Thus, the withstand voltage of the trench capacitor is increased.

BRIEF DESCRIPTION OF THE DRAWINGS

The accompanying drawings, which are incorporated in and constitute a part of the specification, illustrate an embodiment of the invention, and, together with the description, serve to explain the principles of the invention. Of the drawings.

DETAILED DESCRIPTION OF THE INVENTION

Figure 1A:
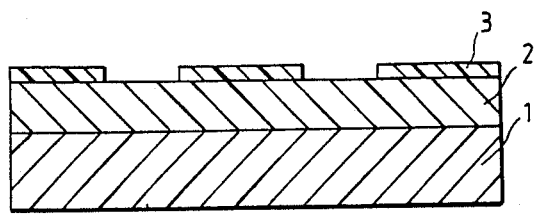
FIGS. 1A to 1D are cross-sectional views sequentially illustrating the steps of one conventional process.
Figure 1B:
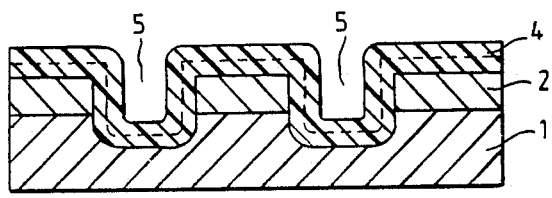
Figure 1C:
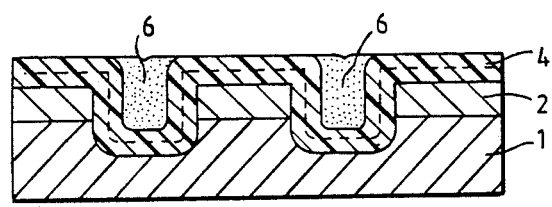
Figure 1D:
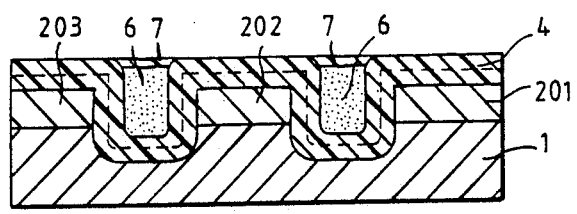
Figure 1E:
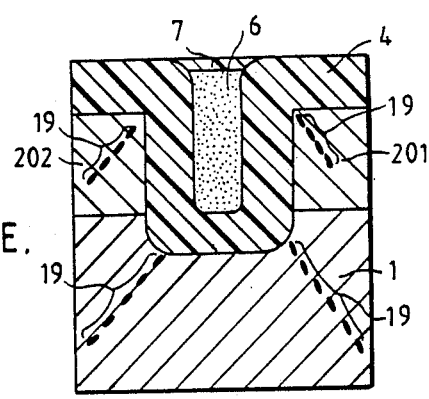
FIG.1E is a partial enlarged cross-sectional view of FIG. 1D.
Figure 2A:
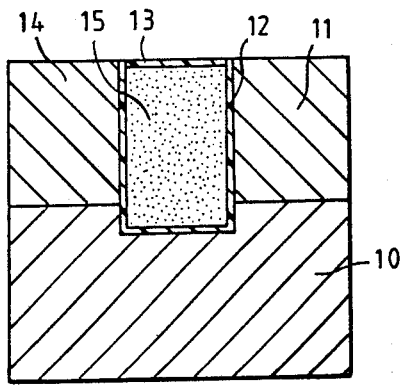
FIGS. 2A and 2B are cross-sectional views sequentially illustrating the steps of another conventional process.
Figure 2B:
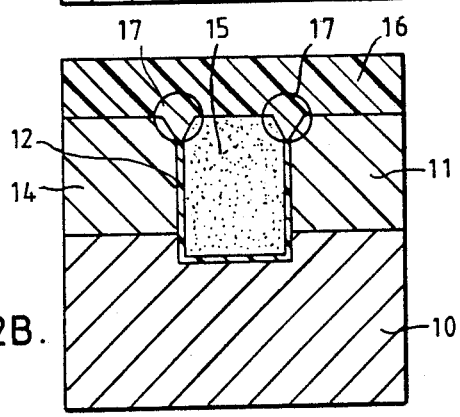
Figure 3A:
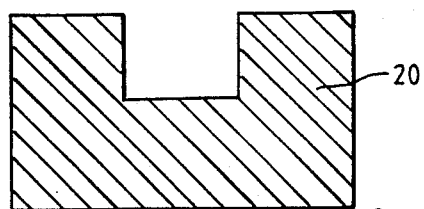
FIGS. 3A to 3C are cross-sectional views illustrating the steps of another conventional process.
Figure 3B:
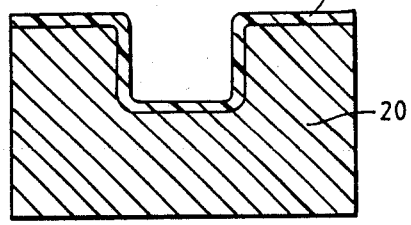
Figure 3C:
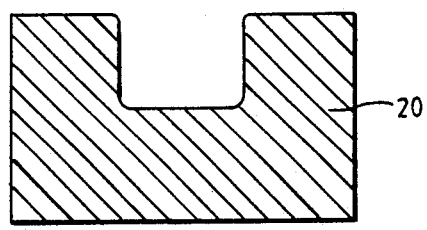
Figure 3D:
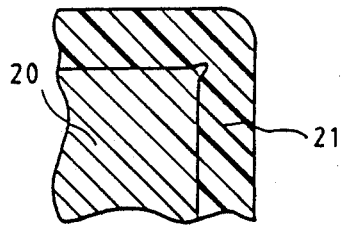
FIG. 3D is an enlarged cross-sectional view illustrating the corners of the trench region.
Figure 4A:
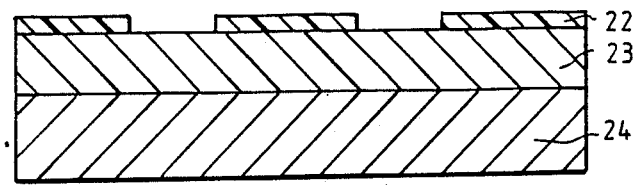
FIGS. 4A to 4F are cross-sectional views sequentially illustrating the steps of one embodiment of the invention.
Figure 4B:
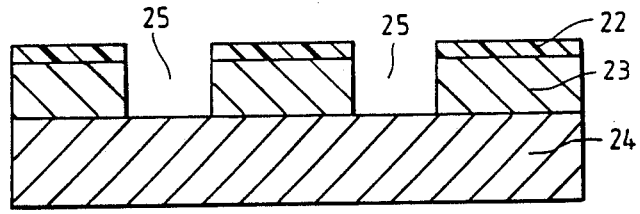
Figure 4C:
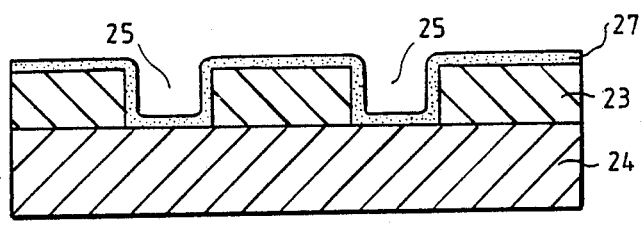
Figure 4D:
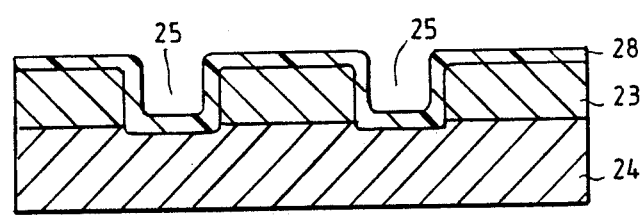
Figure 4E:
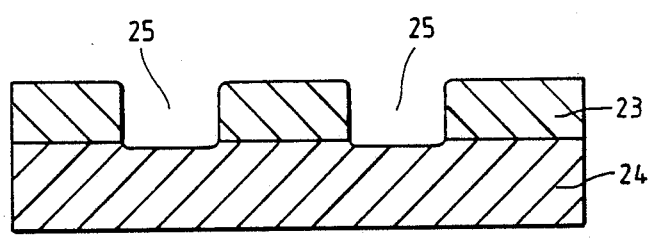
Figure 4F:
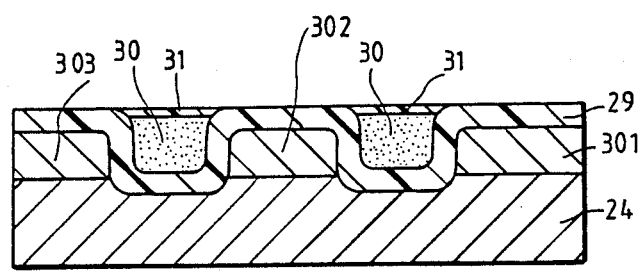

One embodiment of this invention is illustrated in FIGS. 4A to 4F. At first, a semiconductor substrate 24 of a first conductivity type, e.g., P type or N type is prepared. On the semiconductor substrate 24, an epitaxial layer 23 of a second conductivity type, e.g., N type or P type, is formed. The thickness of the epitaxial layer is chosen, e.g., between 1 to 2 $\mu$m. Next, an insulating oxide layer 22 is formed by conventional oxidation treatment. The insulating layer 22 is partially removed to selectively expose the surface of the epitaxial layer 22, as illustrated in FIG. 4A, using a photo-etching process. Next, an etching process is carried out to form trench regions 25, as shown in FIG. 4B. The depth of the trench region is chosen approximately equal to the depth of an isolation region to be formed. In this etching process, it is preferable to use a dry etching process such as reactive ion etching (RIE) using the remaining insulating layer 22 as a mask, rather than a wet etching process using, e.g., HF and $HNO_3$, so as to prevent side etching. Next, the remaining insulating layer 22 is removed. Then, a polycrystalline layer 27 is deposited over the surface by chemical vapor deposition (CVD). In this case, because of the property of the polycrystalline layer of covering the corner roundly, the corner of the trench region after the formation of the polycrystalline layer 27 becomes round. To get a good coverage of the polycrystalline layer at the corners of the trench region 25, a low pressure CVD(LPCVD), e.g., under a reduced pressure of about 150m Torr, is preferable. The thickness of the polycrystalline layer 27 should be chosen considering the width of the trench region 25. For example, when the width of the trench region 25 is between 1 and 1.5 $\mu$m, the thickness of the polycrystalline layer 27 is selected between a few hundred Å and 3,000 Å. Next, an oxidation treatment is carried out to convert the polycrystalline layer 27 into an insulating oxide layer 28 to fill partially the trench regions 25, as shown in FIG.4D. In the case where the insulating oxide layer 28 fills the trench regions 25 completely, great stress occurs within the trench regions 25. Therefore, great stress is applied to the epitaxial layer 23 from the side thereof. Thus, it is preferable to fill the trench regions 25 partially with the insulating oxide layers 28. In this step, a part of the substrate 24 and the epitaxial layer 23 is also oxidized. As the corners of the trench region are covered roundly with the polycrystalline layer 27, the stress concentrations at the corners during the formation of the insulating oxide layer 28 are reduced. Thus, the oxidation of the corners of epitaxial layer 23, during the oxidation process of the polycrystalline layer 27, is done substantially according to the oxygen profile diffused into the epitaxial layer 23. As the oxygen profile at the corners of the epitaxial layer 23 is round, the corners of the epitaxial layer after the oxidation become round. Then, the insulating oxide layer 28 is removed by an etching process, e.g., wet etching using HF etchant, as shown in FIG. 4E. As the corners of the epitaxial layer 23 are oxidized roundly, the shape of the corners after the removal of the insulating oxide layer 28 is round. Next, oxidation treatment is carried out to form an insulating oxide layer 29 serving as a protection layer of the trench region 25 and as a field oxide layer. In this oxidation treatment, as the corners of the epitaxial layer 23 are round, the stress towards the corners at the oxidation treatment is reduced. Thus, the corners are oxidized roundly in accordance with the profile of the oxygen diffused into the epitaxial layer 23 without causing stress concentrations at the corners. The thickness of the insulation layer 29 is chosen between 8,000 and 10,000 Å, for example. Next, a polycrystalline layer of sufficient thickness to fill the trench region is deposited by a CVD process. It is preferable to choose a thickness of the polycrystalline layer of more than 1.2 to 1.5 times the width of the trench region after the formation of the insulating oxide layer 29 to obtain a flat surface. Next, an etching process, e.g., a plasma etching process, is performed to remove the excess polycrystalline layer over the insulating layer 29. Next, an oxidation treatment is carried out to form an insulating oxide layer 31 at the surface of the polycrystalline layer 30, as shown in FIG. 4H. In this way, epitaxial island regions 301, 302 and 303 are achieved. Successively, circuit elements are formed in these island regions (not illustrated).

Figure 5A:
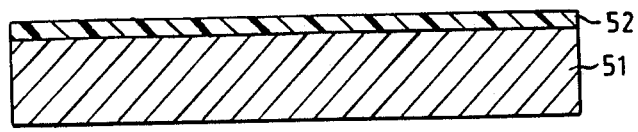
FIG. 5A to 5H are cross-sectional views sequentially illustrating the steps of another embodiment of the invention.
Figure 5B:
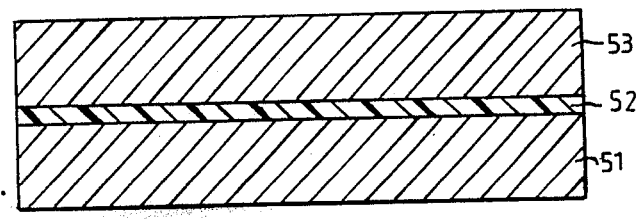
Figure 5C:
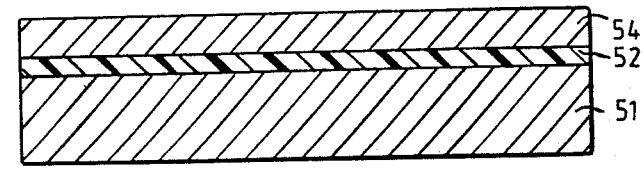
Figure 5D:
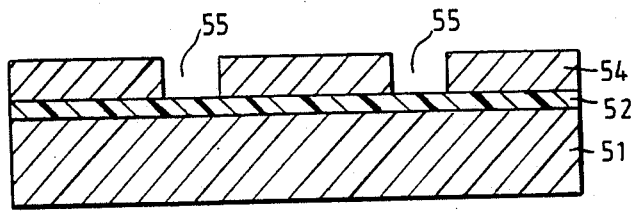
Figure 5E:
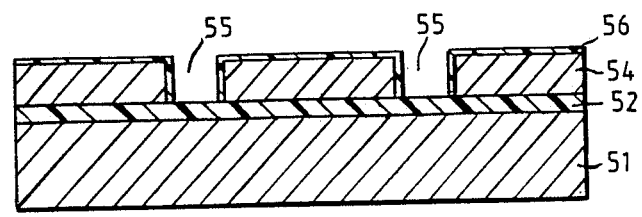
Figure 5F:
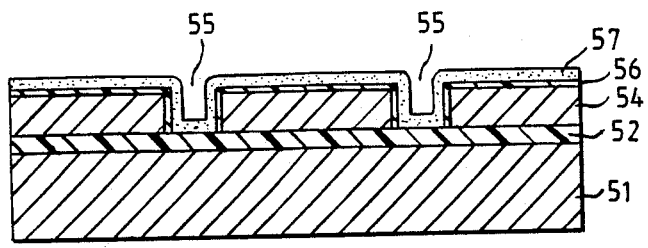
Figure 5G:
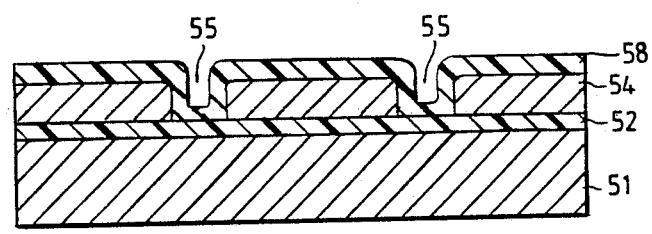
Figure 5H:
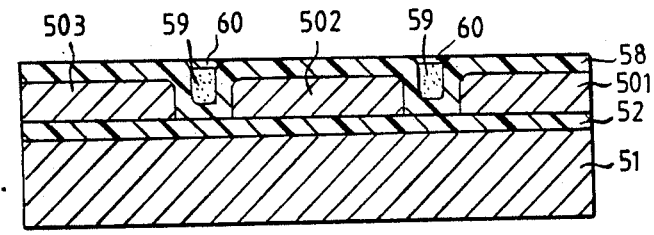
Figure 5I:
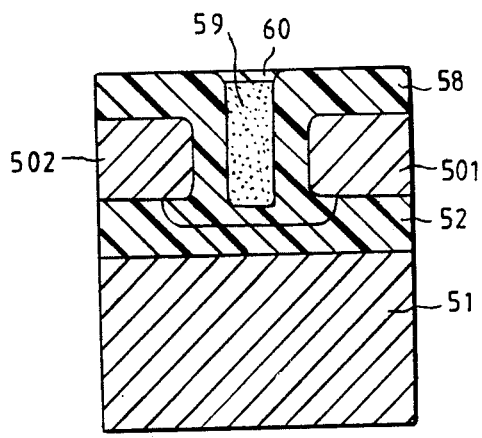
FIG. 5I is a cross-sectional view of the trench region.

FIGS. 5A to 5I shows another embodiment of this invention. At first, a semiconductor wafer 51 of about 450 to 625 $\mu$m of a first conductivity type, e.g.,P type or N type, is prepared. Then, an oxidation treatment at a temperature of about 1100° C. is carried out to form an insulating oxide film 52 of about 1 $\mu$ thickness over the surface of the semiconductor wafer 51, as shown in FIG.5A. Then, a second semiconductor wafer 53, having a mirror face, of P type or N type is positioned on the insulating layer 52 so as to face the mirror face to the insulating layer 52. The an annealing process of about 2 hours at a temperature of 1100° C. in nitrogen atmosphere is carried out to provide a combination structure of two wafers 51, 52 and an insulating oxide layer 52, as shown in FIG. 5B. Next, an etching process, including a lapping process, is applied to the wafer 53 to produce a semiconductor layer 54 of about $\mu$m thickness. Next, an anisotropic etching process such as RIE, is carried out to form trench regions 55 of about 1 $\mu$m width as shown in FIG.5D. Then, an oxidation treatment at a temperature of about 1,000° C. is carried out to form a thin oxide layer 56 of about 200 Å thickness at the surface of the semiconductor substrate 54, as shown in FIG. 5E. As the oxide layer 56 is thin, the stress towards the corners of the trench region 55 is small. Next, a polycrystalline layer 57 of about 2,000 Å thickness is formed over the entire surface, as shown in FIG.5F. In this case, because of the property of the polycrystalline layer of covering the corner roundly, the corners of the trench region after the formation of the polycrystalline layer 57 become round. In this forming process of the polycrystalline layer 57, it is preferable to use LPCVD, of about 150 m Torr, to improve the coverage of the polycrystalline layer at the corners of the trench region. The structure is then subjected to an oxidation treatment at a temperature of about 1,100° C. to convert the polycrystalline layer 57 into an insulating oxide layer. In FIG. 5G, the numeral 58 designates the total insulating oxide layer of the insulating layer 56, the converted insulating oxide layer of the polycrystalline layer 57 and the oxide layer of the semiconductor layer 54 formed during the oxidation process of the polycrystalline layer 57. As the corners of the trench region are covered roundly with the polycrystalline layer 57, the stress concentration at the corners during the formation of the insulating oxide layer 58 is reduced. Thus, the oxidation at the corners of semiconductor layer 54, during the oxidation process of the polycrystalline layer 57, is done substantially according to the oxygen profile diffused into the semiconductor region 54. As the oxygen profile at the corners of the semiconductor region 54 is round, the corners of the semiconductor region after the oxidation of the semiconductor region 54 become round. Then, a polycrystalline layer is formed over the surface. It is preferable to choose a thickness of the polycrystalline layer of more than 1.2 to 1.5 times the width of the trench region after the formation of the insulating oxide layer 58. Then, an etching process is carried out to remove the excess polycrystalline layer over the insulating layer 58 to produce a flat surface. Next, the construction is subjected to an oxidation treatment to form an insulating oxide layer at the surface of the polycrystalline layer 59. In this way, island regions 501, 502 and 503 surrounded by insulating material, are achieved, as shown in FIG. 5H. In this embodiment, the property of the polycrystalline layer of covering the corners of trench region roundly is used, also. In the actual process, the insulating layer 52 is etched during the etching process for forming the trench regions 55. Thus, an overhanging structure of the island regions 501, 502 at the bottom of the trench region 55 is formed, as shown in FIG. 5I. However, using this invention, the bottom corners of the semiconductor layer 54 also are covered roundly with the polycrystalline layer 57. Thus, the stress concentration during formation of the thick insulating layer 58 at the bottom corners of the semiconductor region 54 is also reduced.

The present invention has been described with respect to a specific embodiment. However, other embodiments based on the principles of the present invention should be obvious to those of ordinary skilled in the art. Such embodiments are intended to be covered by the claims.

What is claimed is:

1. A method of manufacturing a semiconductor device, comprising the steps of:

preparing a semiconductor substrate having a first surface;

forming a trench region in the first surface of the substrate, having corners at the intersections of the trench region with the first surface;

forming a first polycrystalline layer on the first surface covering the corners of, and only partially filling the trench region;

oxidizing the first polycrystalline layer;

oxidizing the corners of the trench region during the oxidation of the first polycrystalline layer to form an oxidized layer at the corners;

removing the oxidized layer formed at the corners of the trench region thereby rounding the corners of the trench region and exposing the rounded corners;

subjecting the semiconductor substrate having the rounded corners to an oxidation treatment to form a first insulating layer to fill the trench region partially; and forming a second polycrystalline layer over the first insulating layer to fill the trench region completely.

2. The method of claim 1, comprising the additional step of forming a second insulating layer before the formation of the first polycrystalline layer.

3. The method of claim 1, wherein the step of forming the trench region includes the step of anisotropic etching.

4. The method of claim 1, wherein the step of preparing the substrate comprises the steps of:

preparing a first semiconductor substrate having a surface;

forming an intermediate insulating layer on the surface of the first substrate;

forming a second semiconductor substrate having a predetermined thickness on the intermediate insulating layer.

5. The method of claim 1, wherein the step of forming the first polycrystalline layer includes the step of low pressure chemical vapor deposition.

* * * * *